United States Patent [19]

Suzuki

[11] Patent Number: 4,971,886
[45] Date of Patent: Nov. 20, 1990

[54] RECORDING MEDIUM HAVING HEAT-SENSITIVE CHROMOGENIC MATERIAL, AND IMAGE REPRODUCING METHOD BY USING THE MEDIUM

[75] Inventor: Keiko Suzuki, Okazaki, Japan

[73] Assignee: Brother Kogyo Kabushiki Kaisha, Aichi, Japan

[21] Appl. No.: 227,658

[22] Filed: Aug. 3, 1988

[30] Foreign Application Priority Data

Aug. 10, 1987 [JP] Japan ................ 62-199542

[51] Int. Cl.$^5$ ............ G03C 1/68; B41M 5/26
[52] U.S. Cl. ................... 430/138; 430/203; 428/402.2; 428/402.24; 503/210; 503/211; 503/214; 503/215
[58] Field of Search ........ 430/138, 203, 281; 428/402.2, 402.22; 503/210, 211, 214, 215

[56] References Cited

U.S. PATENT DOCUMENTS

| | | | |
|---|---|---|---|
| 3,856,554 | 12/1974 | Jablonski et al. | 503/203 |
| 3,912,831 | 10/1975 | Kan et al. | 503/211 |
| 4,191,404 | 3/1980 | Lee et al. | 503/211 |
| 4,399,209 | 8/1983 | Sanders et al. | 430/138 |
| 4,435,471 | 3/1984 | Matsushita et al. | 503/210 |
| 4,440,846 | 4/1984 | Sanders et al. | 430/211 |
| 4,474,898 | 10/1984 | Matsushita et al. | 503/203 |
| 4,576,891 | 3/1986 | Adair et al. | 430/138 |
| 4,579,770 | 4/1986 | Matsushita et al. | 428/216 |
| 4,602,264 | 7/1986 | Shioi et al. | 503/211 |
| 4,629,676 | 12/1986 | Hayakawa et al. | 430/203 |
| 4,703,335 | 10/1987 | Matsushita et al. | 503/226 |
| 4,704,379 | 11/1987 | Shioi et al. | 503/211 |
| 4,740,494 | 4/1988 | Watanabe | 503/226 |
| 4,760,048 | 7/1988 | Kurihara et al. | 430/138 |
| 4,782,003 | 11/1988 | Yoshihara | 430/138 |
| 4,824,824 | 4/1989 | Matsushita et al. | 503/217 |

OTHER PUBLICATIONS

Derwent Abstracts, "Multicolored Heat-Sensitive . . . ," J62.156986, 7/87, Fuji Photo.
Derwent Abstracts, "Heat-Sensitive Recording Material . . .," J59 229,392, 12/84, Ricoh kk.

*Primary Examiner*—Paul R. Michl
*Assistant Examiner*—Patrick A. Doody
*Attorney, Agent, or Firm*—Oliff & Berridge

[57] ABSTRACT

A recording medium comprising a planar substrate, and a layer of microcapsules carried by the planar substrate, each of the microcapsules containing a photosensitive material whose hardness varies upon exposure to a radiation, and a heat-sensitive chromogenic material which produces a color at a temperature higher than a room temperature.

10 Claims, 3 Drawing Sheets

RECORDING MEDIUM HAVING HEAT-SENSITIVE CHROMOGENIC MATERIAL, AND IMAGE REPRODUCING METHOD BY USING THE MEDIUM

BACKGROUND OF THE INVENTION

1. Field of the Invention

The present invention relates to a recording medium for reproducing images, which has a layer of photosensitive microcapsules that are cured or softened upon exposure to a radiation. The invention is also concerned with a method of reproducing images or making copies of a document, by utilizing a recording medium as indicated above.

2. Background of the Invention

There is known a recording medium which has a planar substrate coated with a layer of microcapsules each containing a radiation-curable photosensitive material and a chromogenic material. Images are reproduced according to varying hardness of the microcapsules in the local areas of the medium.

A recording medium of the type indicated above is indicated generally at 50 in FIG. 5. The recording medium 50 includes a planar substrate 51 coated with a developer layer 53, and a microcapsule layer 54 formed on the developer layer 53. The microcapsule layer 54 consists of a multiplicity of microcapsules 55. Each microcapsule 55 has a shell 57 encapsulating an internal liquid phase 59 which includes a radiation-curable composition and a chromogenic material. The developer layer 53 consists of a developer material which is capable of chemically reacting with the chromogenic material of the internal phase 59 of the microcapsules 55, and thereby cooperating with the chromogenic material to produce a color or colors.

Referring to FIGS. 6 and 7, there is illustrated a method by which images are reproduced on the recording medium 50. In the method, an original 63 bearing an image thereon is irradiated with a radiation produced by a light source 61. Due to imaged and non-imaged local areas of the original 63, the corresponding local areas of the microcapsule layer 54 are selectively exposed and remain unexposed to the radiation. The microcapsules 55a in the exposed local areas of the microcapsule layer 54 are cured and hardened, as indicated in FIG. 6. In the next step, the recording medium 50 is passed through a pressure nip between two presser rolls 65, 65 as indicated in FIG. 7 (wherein only one of the two presser rolls is shown), whereby the uncured microcapsules 55b in the unexposed local areas of the microcapsule layer 54 are ruptured. As a result, the chromogenic material comes out of the ruptured microcapsules 55b, and chemically reacts with the developer material of the developer layer 53. Thus, the images on the original 63 are reproduced on the recording medium 50, by imagewise exposing the microcapsule layer 54 to the radiation through the original 63.

Another known method of reproducing images employs two separate sheets. The first sheet has a microcapsule layer formed on a planar substrate, while the second sheet has a developer layer formed on a planar substrate. The microcapsule layer of the first sheet is imagewise exposed to a radiation in the same manner as described above, and the second sheet is superposed on the thus exposed first sheet. A pressure is applied to the superposed first and second sheets, to thereby rupture the uncured microcapsules and cause a chemical reaction between the chromogenic material of the ruptured microcapsules and the developer material of the developer layer of the second sheet, whereby the images on the original are reproduced.

The conventional imaging methods discussed above require a recording medium or sheet which is coated with a layer of a developing material which is capable of chemically reacting with a chromogenic material of the microcapsules. Thus, the conventional methods do not permit image reproduction on an ordinary sheet. The cost of the recording medium having both the microcapsule layer and the developer layer is considerably higher than an ordinary sheet of paper. Accordingly, the cost of image reproduction using this type of recording medium is considerably high. Further, the cost of image reproduction using two separate sheets as described above is also comparatively high.

SUMMARY OF THE INVENTION

It is therefore an object of the present invention to provide a comparatively inexpensive recording medium which has a layer of microcapsules.

Another object of the invention is to provide a recording medium which permits image reproduction on an ordinary sheet.

The above objects may be attained according to the principle of the present invention, which provides a recording medium comprising a planar substrate, and a layer of microcapsules carried by the planar substrate, each of the microcapsules containing a photosensitive material whose hardness varies upon exposure to a radiation, and a heat-sensitive chromogenic material which produces a color at a temperature higher than a room temperature.

The hardness of the photosensitive material contained in the microcapsules in each local area of the microcapsule layer of the instant recording medium is changed according to an amount of exposure of the local area to an image radiation, which represents an image to be reproduced. In other words, a latent image is formed on the microcapsule layer, by imagewise exposing the microcapsule layer to the radiation. The heat-sensitive chromogenic material contained in the microcapsules in the local areas of the imagewise exposed microcapsule layer produces a color at an elevated temperature, depending upon the hardness of the photosensitive material in the local areas, whereby the image is reproduced.

The chromogenic material contained in the microcapsules produces a color when it is heated to a suitable elevated temperature higher than the room temperature. Hence, images may be reproduced without using a medium or sheet which is coated with a layer of a developer material as used in the known imaging method which uses microcapsules. Certainly, the instant recording medium is inexpensive as compared with the known recording medium which has a developer layer as well as a microcapsule layer.

While a visible image may be reproduced on the instant recording medium by heating the medium, the chromogenic material may be transferred from the recording medium to an ordinary sheet of paper, for example. More specifically, the chromogenic material is transferred from the microcapsules in the selected areas (either exposed areas or unexposed areas) of the imagewise exposed microcapsule layer of the recording medium, before the chromogenic material is heated to produce a color. In this case, a latent image formed by the chromogenic material on the instant recording medium may be developed by heating of the medium, into a visible image on the ordinary sheet.

The heat-sensitive chromogenic material may comprise at least one organometallic complex selected from the group consisting of $NH_4VO_3$, $2PbCO_3\,Pb(OH)_2$, $Co(CH_3OO)_2$, $Co(HCOO)_2$, $[Cr(OH)_3](CNS)_3$, and $[Cr(NH_3)_3](CNS)_3$, which produce color at temperatures higher than 150° C., 285° C., 82° C., 116° C. and 121° C., respectively. Alternatively, the chromogenic material may comprise a leuco pigment and an acid substance. Since the temperature of a recording apparatus for reproducing images by using the instant recording medium may arise to a level higher than the room temperature, it is desirable that the working temperature at which the chromogenic material produces a color be higher than 60° C., preferably between 70° C. and 150° C., and more preferably between 90° C. and 120° C. However, the working temperature of the heat-sensitive chromogenic material must be lower than a level at which the recording medium is deteriorated by heat. For example, the working temperature is preferably lower than 170–180° C., where a PET (Polyethyleneterephthalate) film is used as a copy sheet to which the chromogenic material is transferred from the microcapsule layer of the medium, as described below. Where the copy sheet is made of a paper material, the working temperature of the chromogenic material is preferably lower than 200° C.

The photosensitive material may be a material which is curable upon exposure to a radiation. The radiation-curable material may comprise ethylenically unsaturated acid esters of polyhydric alcohols.

The microcapsules may further contain the following additives, alone or in combination: photoinitiator; binder; plasticizer; and a photosensitizer. The photoinitiator may comprise at least one material selected from the group consisting of benzophenones, xanthones, thioxanthones, halogenated paraffins, and benzoin alkyl ethers. The binder may comprise at least one of copolymers of acrylic acids, copolymers of itaconic acids, and copolymers of partially esterified maleic acids. The plasticizer may comprise at least one of dioctyl phthalate and didodecylphthalate. The photosensitizer may comprise n-Butylamines and Triethylamines. Preferably, the recording medium comprises about 50 parts by weight of the photosensitive material, about 3 parts by weight of the chromogenic material, 2.5–4 parts by weight of the photoinitiator, no more than one part by weight of the binder, and no more than one part by weight of the plasticizer, and further comprises the photosensitizer in an amount of about 10% by weight of the photoinitiator.

A further object of the invention is to provide an imaging method by which images are economically reproduced by using a recording medium which has a layer of microcapsules.

The above object may be achieved according to another aspect of the present invention, which provides an imaging method comprising the steps of: imagewise exposing a layer of microcapsules of a recording medium as described above, to a radiation; superposing a copy sheet on the imagewise exposed layer of microcapsules of the recording medium; applying pressure to the copy sheet and the recording medium which have been superposed on each other, and thereby rupturing the microcapsules whose photosensitive material is soft; and heating the copy sheet on which the heat-sensitive chromogenic material has been transferred from the ruptured microcapsules on the recording medium. Thus, the instant method permits reproduction of desired images on an ordinary copy sheet without a developer layer, by heating the copy sheet after the imagewise exposed recording medium and the copy sheet superposed on the medium are subjected to a developing operation under pressure. Accordingly, the cost of image reproduction according to the method of the present invention is significantly reduced as compared with that using the known recording medium or two separate sheets.

BRIEF DESCRIPTION OF THE DRAWINGS

The above and other objects, features and advantages of the present invention will be better understood by reading the following detailed description of a presently preferred embodiment of the invention, when considered in connection with the accompanying drawings, in which.

DETAILED DESCRIPTION OF THE PREFERRED EMBODIMENT

Figure 1:
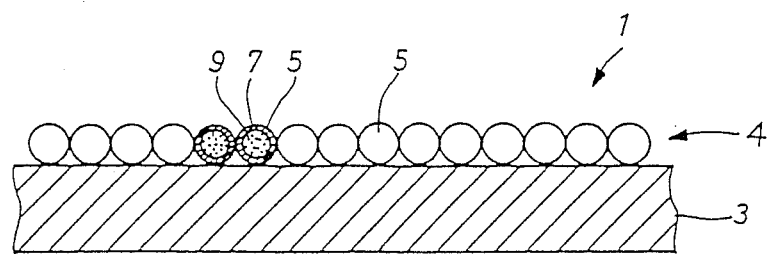
FIG. 1 is a fragmentary enlarged elevational view in cross section of a recording medium embodying the present invention.

Referring first to FIG. 1, a recording medium or imaging sheet embodying the present invention is indicated at 1. As shown in the figure, the recording medium 1 has a planar substrate 3, and a microcapsule layer 4 which includes a multiplicity of microcapsules 5. Each microcapsule 5 includes a shell 7 encapsulating an internal liquid phase 9 which principally consists of a photosensitive material in the form of a radiation-curable composition which is curable upon exposure thereof to a radiation, and a heat-sensitive chromogenic material.

The heat-sensitive chromogenic material produces a color at a working temperature higher than a predetermined lower limit. For example, the chromogenic material consists of at least one organometallic complex which is selected from the group which consists of $NH_4VO_3$, $2PbCO_3.Pb\,(OH)_2$, $Co(CH_3COO)_2$, $Co(HCOO)_2$, $[Cr(OH)_3](CNS)_3$, and $[Cr(NH_3)_3](CNS)_3$, whose lower limits of the working temperature are 150° C., 285° C., 82° C., 116° C. and 121° C., respectively. Alternatively, the chromogenic material may include a leuco pigment and an acid substance. To avoid production of color at a room temperature due to rupturing of the microcapsules 5, it is desirable that the working temperature of the chromogenic material be higher than 60° C. However, the chromogenic material is formulated so that the working temperature is held preferably within a range of 70–150° C., more preferably within a range of 90–120° C.

The radiation-curable composition is selected from radiation-polymerizable compounds which are polymerizable upon exposure to a radiation. For instance, the radiation-curable composition includes ethylenically unsaturated acid esters of polyhydric alcohols, such as trimethylolpropane triacrylate.

The internal liquid phase 9 may preferably include a photoinitiator, a binder, a plasticizer, a photosensitizer, and other additives, as needed, in order to promote the properties of the radiation-curable composition, that is, to enable the internal liquid phase 9 to be cured to a high degree of hardness, with a small amount of exposure to a radiation, in a short period of time.

The photoinitiator consists of at least one material which is selected from the group which includes benzophenones, xanthones, thioxanthones, halogenated paraffins, and benzoin alkyl ethers. The binder consists of at least one material which is selected from the group including copolymers of acrylic acids, copolymers of itaconic acids, and copolymers of partially esterified maleic acids. As the plasticizer, dioctyl phthalate and didodecylphthalate may be used. As the photosensitizer, n-Butylamines and Triethylamines may be used.

The microcapsule layer 4 may be formed on the substrate 3, by a known technique such as coacervation process or interfacial polymerization process. Usually, the internal liquid phase 9 which fills the shell 7 consists of about 50 parts by weight of a radiation-polymerizable compound (as the photosensitive material), about 3 parts by weight of a heat-sensitive chromogenic material, about 2.5-4 parts by weight of a photoinitiator, no more than one part by weight of a binder, no more than one part by weight of a plasticizer, and a photosensitizer which is included in an amount of about 10% of the photoinitiator.

Figure 2:
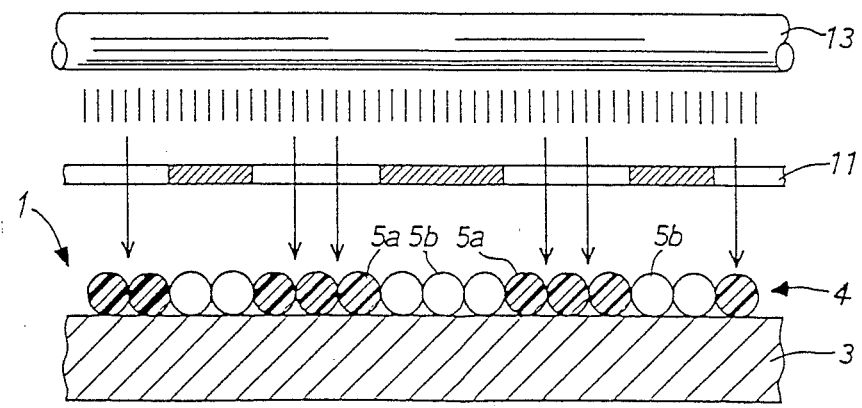
FIGS. 2–4 are schematic elevational views illustrating a method of reproducing images by using the recording medium of FIG. 1.

Referring to FIG. 2, there will be described a manner in which an image is reproduced by using the recording medium 1 which has been described above. As shown in the figure, an original 11 in the form of a transparency or slide film which bears an image to be reproduced is positioned above the recording medium 1. Above this original 11 is provided a light source 13 in the form of a rod. The microcapsule layer 4 is irradiated by a radiation produced by the light source 13, through the original 11. Since the original 11 has transparent and non-transparent local areas, only the microcapsules 5a in the local areas of the microcapsule layer 4 which correspond to the transparent local areas of the original 11 are exposed to the radiation, whereby the microcapsules 5a are cured and hardened due to the polymerization of the radiation-polymerizable material, with the aid of the photoinitiators and other additives described above. On the other hand, the microcapsules 5b in the local areas of the microcapsule layer 4 which correspond to the non-transparent local areas of the original 11 remain unexposed, and therefore unpolymerized (uncured).

Figure 3:
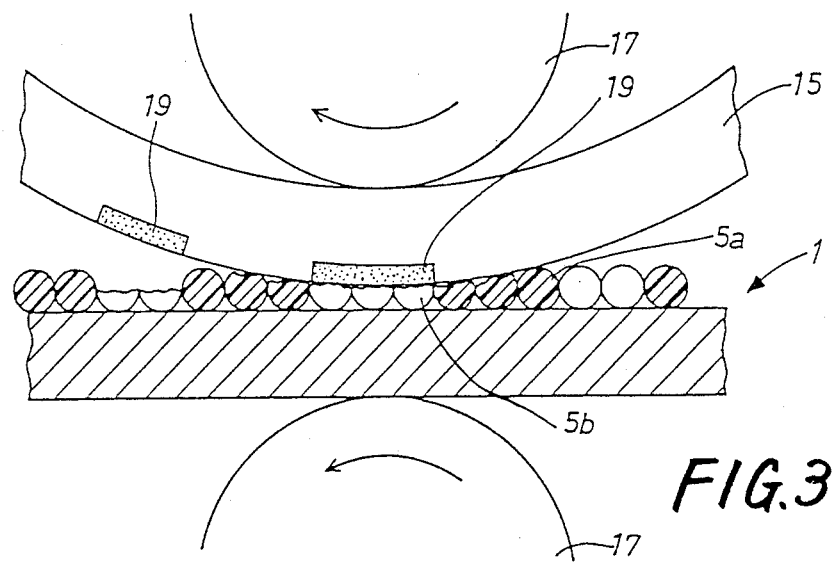

A copy sheet 15, which is an ordinary sheet of paper, is superposed on the recording medium 1 whose microcapsule layer 4 has been thus image wise exposed to the radiation. The superposed recording medium 1 and copy sheet 15 are passed through a pressure nip between a pair of presser rolls 17, 17, as indicated in FIG. 3. As a result, the uncured microcapsules 5b are ruptured, and the heat-sensitive chromogenic material comes out of the ruptured microcapsules 5b and is transferred to the surface of the copy sheet 15, as indicated at 19 in FIG. 3, whereby a latent image corresponding to the image on the original 11 is formed on the copy sheet 15.

Figure 4:
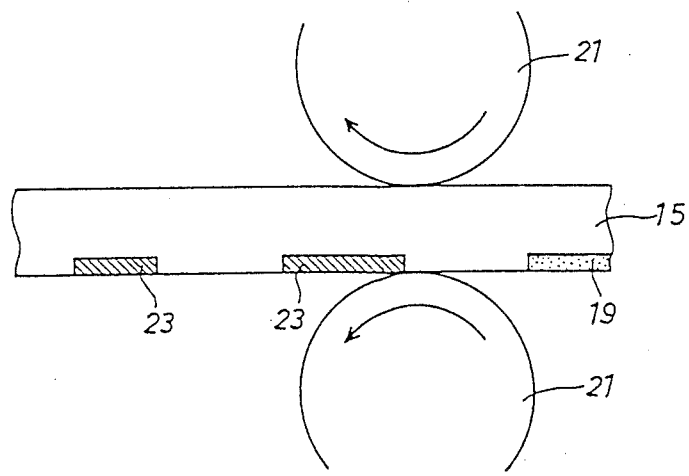
Figure 5:
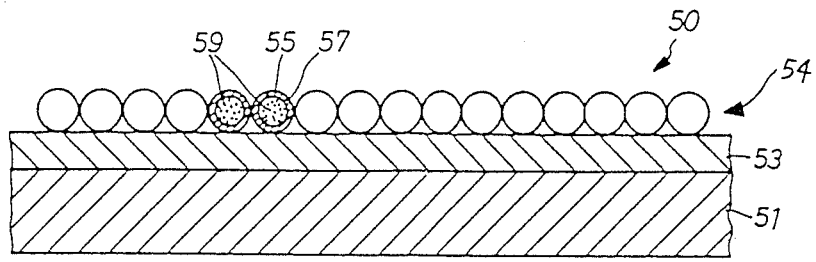
FIG. 5 is a fragmentary enlarged elevational view in cross section of a known recording medium.
Figure 6:
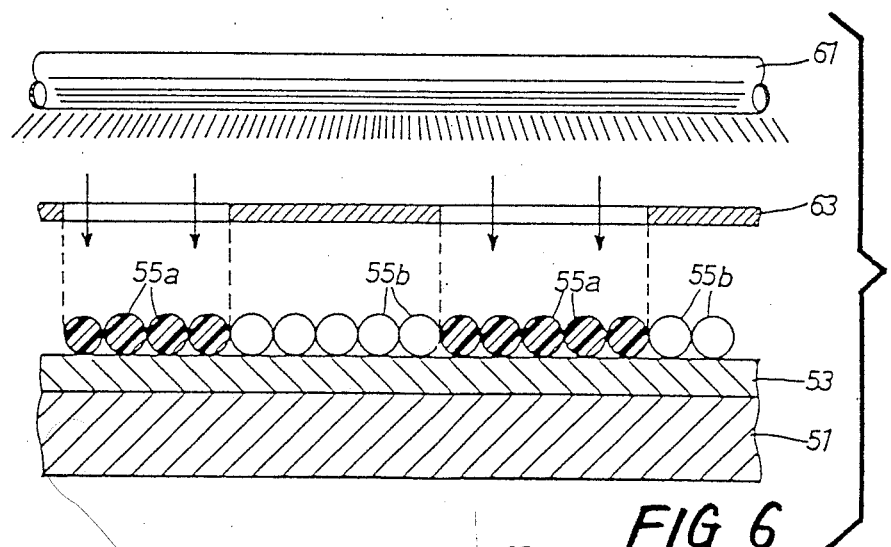
FIGS. 6 and 7 are schematic elevational views illustrating a method of reproducing images by using the known recording medium of FIG. 5.
Figure 7:
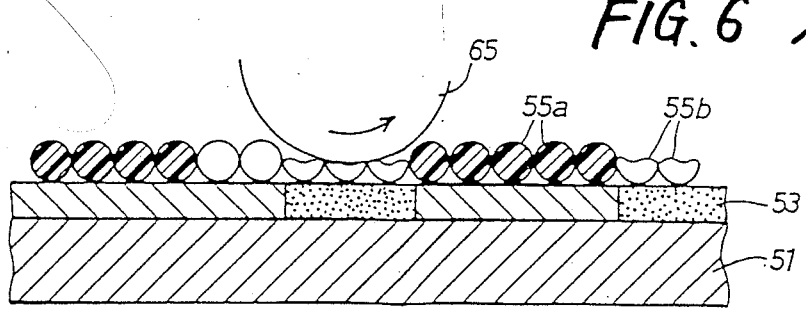

In the next step, the copy sheet 15 is separated from the recording medium 1, and is passed between a pair of heating rolls 21, 21 equipped with heat-generating elements, as shown in FIG. 4. Since the operating temperature of the heating rolls 21, 21 is determined to be higher than the working temperature of the heat-sensitive chromogenic material at which the chromogenic material produces a color, the chromogenic material 19 transferred to the copy sheet 15 is heated to its working temperature (e.g., 150° C., where $NH_4VO_3$ is used as the chromogenic material) and consequently produces a color on the surface of the copy sheet 15. Thus, the latent image 19 is developed into a visible image as indicated at 23 in FIG. 4. Thus, the image on the original 11 is reproduced on the copy sheet 15.

What is claimed is:

1. A recording medium comprising a planar substrate, and a layer of microcapsules carried by said planar substrate, each of said microcapsules containing a photo sensitive material whose hardness varies upon exposure to a radiation, and a heat-sensitive chromogenic material which produces a color at a temperature higher than at room temperature, said chromogenic material comprising at least one organometallic complex selected from the group consisting of $NH_4VO_3$, $2PbCO_3 \cdot Pb(OH)_2$, $Co(CH_3COO)_2$, $Co(HCOO)_2$, $[Cr(OH)_3](CNS)_3$, and $[Cr(NH_3)_3](CNS)_3$.

2. A recording medium according to claim 1, wherein said chromogenic material further comprises a leuco pigment and an acid substance.

3. A recording medium according to claim 1, wherein said photosensitive material comprises a radiation-curable material.

4. A recording medium according to claim 3, wherein said radiation-curable material comprises ethylenically unsaturated acid esters of polyhydric alcohols.

5. A recording medium according to claim 1, wherein said each microcapsule further contains at least one of a photoinitiator, a binder, a plasticizer and a photosensitizer.

6. A recording medium according to claim 5, wherein said photoinitiator comprises at least one material selected from the group consisting of benzophenones, xanthones, thioxanthones, halogenated paraffins, and benzoin alkyl ethers.

7. A recording medium according to claim 5, wherein said binder comprises at least one of copolymers of acrylic acids, copolymers of itaconic acids, and copolymers of partially esterified maleic acids.

8. A recording medium according to claim 5, wherein said plasticizer comprises at least one of dioctyl phthalate and didodecylphthalate.

9. A recording medium according to claim 5, wherein said photosensitizer comprises n-Butylamines and Triethylamines.

10. A recording medium according to claim 5, comprising about 50 parts by weight of said photosensitive material, about 3 parts by weight of said heat-sensitive chromogenic material, 2.5-4 parts by weight of said photoinitiator, no more than one part by weight of said binder, and no more than one part of weight of said plasticizer, and further comprising said photosensitizer in an amount of about 10% by weight of said photoinitiator.

* * * * *